(12) United States Patent
Eker

(10) Patent No.: US 7,692,458 B1
(45) Date of Patent: Apr. 6, 2010

(54) WIDE DYNAMIC RANGE CHARGE PUMP

(75) Inventor: Mehmet Mustafa Eker, San Marcos, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 67 days.

(21) Appl. No.: 12/249,915

(22) Filed: Oct. 11, 2008

(51) Int. Cl.
*H03L 7/00* (2006.01)
*H03L 7/06* (2006.01)

(52) U.S. Cl. ...................... 327/148; 327/157

(58) Field of Classification Search .......... None
See application file for complete search history.

(56) References Cited

U.S. PATENT DOCUMENTS

| | | | |
|---|---|---|---|
| 7,082,177 B2 * | 7/2006 | Arkiszewski | 375/376 |
| 7,120,217 B2 * | 10/2006 | Schwarzmueller | 375/376 |
| 7,158,600 B2 * | 1/2007 | Puccio et al. | 375/376 |
| 2004/0012425 A1 * | 1/2004 | Hsu | 327/157 |
| 2005/0052220 A1 * | 3/2005 | Burgener et al. | 327/536 |

* cited by examiner

*Primary Examiner*—Tuan Lam
(74) *Attorney, Agent, or Firm*—Law Office of Gerald Maliszewski; Gerald Maliszewski

(57) ABSTRACT

A wide dynamic range charge pump is provided for use in a phase-locked loop (PLL) circuit. The charge pump includes a first, second, and third set of current sources. The charge pump further includes a first capacitor having an input connected to the first set. A first operational amplifier (op amp) has an input connected to the first set output, and an output connected to the second set output and to a voltage controlled oscillator (VCO) input. A first resistor has a first end connected to the first op amp output and a second end connected to the third set. A second capacitor has an input connected to the first resistor second end, and an output connected to the second reference voltage.

17 Claims, 5 Drawing Sheets

WIDE DYNAMIC RANGE CHARGE PUMP

BACKGROUND OF THE INVENTION

1. Field of the Invention

This invention generally relates to phase-locked loop (PLL) circuitry and, more particularly, to a wide dynamic range charge pump for use in a PLL.

2. Description of the Related Art

FIG. 1 is a schematic diagram of a conventional charge pump and loop filter (prior art). The charge pump 100 and loop filter 102 are interposed between a phase detector (PHD) or phase/frequency detector (PFD) 104 and a voltage controlled oscillator (VCO), not shown. For simplicity, the common mode feedback (CMF) circuitry is not depicted. The advantage of this circuit is its simplicity. In less critical applications, such as those in which there is no restriction on the maximum loop bandwidth and/or jitter transfer peaking, the circuit is easily implemented. The disadvantage is that the circuit does not permit the independent adjustment of loop bandwidth and jitter transfer peaking. That is, the loop bandwidth and the jitter transfer peaking can not be optimized independently.

FIG. 2 is a schematic diagram of a charge pump and loop filter that circumvents the problems associated with the circuit of FIG. 1 (prior art). Since there are 2 separate current outputs ($I_a$, and $I_b$), the jitter transfer peaking and the loop bandwidth can be adjusted independently. The current, $I_a$, controls the jitter transfer peaking only, and the current, $I_b$, controls the loop bandwidth as well as the peaking. However, after the loop bandwidth is set, the peaking can be re-adjusted by $I_a$ without changing the set bandwidth.

One problem observed in the circuit of FIG. 2 is its inability to accommodate large values of $I_b$, which is limited by the driving capacity of the unity gain buffers 200 and 202. The difficulty arises from the fact that the unity gain buffer is an operational amplifier (op amp) in the voltage-follower configuration. There is really no better unity gain alternative. In the latest technologies, supply voltages are as low as 1.2V. The output of the op amp needs to swing as large as its input, and still maintain a high enough open loop gain so that the close loop gain will be no less than 0.85 worst-case (a reasonable design target). These requirements restrict the driving capability of the output stage. When $I_b$ must be larger than the op amp can drive, the loop bandwidth can no longer be controlled properly.

It would be advantageous if the charge pump of FIG. 2 could be modified to provide a more symmetric, wider dynamic range at its outputs, while increasing the loop bandwidth adjustment range.

SUMMARY OF THE INVENTION

A charge pump and loop filter are presented that address the issues associated with the circuit in FIG. 2. The present invention circuit provides greater symmetric and wider dynamic range than the circuit of FIG. 2. The present invention circuit also has an increased loop bandwidth adjustment range.

Accordingly, a method is provided for controlling current in a wide dynamic range charge pump in a phase-locked loop (PLL) circuit. The method provides a PLL including a phase/frequency detector, a charge pump, and a voltage controlled oscillator (VCO). The charge pump includes a first, second, and third set of current sources. Each set includes a top source connected to a first reference voltage and a top signal input, and an output to supply current responsive to a top signal. Each set also includes a bottom source connected to the top source output and a bottom signal input, and an output connected to a second reference voltage, different than the first reference voltage, to supply current in response to a bottom signal. The charge pump further includes a first capacitor having an input connected to the first set top source output, and an output connected to the second reference voltage. A first operational amplifier (op amp) has an input connected to the first set top source output, and an output connected to the second set top source output and to a voltage controlled oscillator (VCO) input through a first, resistor. The first resistor has a first end connected to the first op amp output and a second end connected to the third set top source output. A second capacitor has an input connected to the first resistor second end, and an output connected to the second reference voltage.

The method receives a phase detector/phase-frequency detector (PHD/PFD) first output as the top signal and a PHD/PFD second output as the bottom signal input. A first current (Iap) is supplied from the top source output responsive to the difference between the top and bottom signal inputs. The PHD/PFD first output is received as the bottom signal and the PHD/PFD second output as the top signal input. A second current (Ibp2) is supplied from the top source output responsive to the difference between the top and bottom signal inputs. The PHD/PFD first output is received as the top signal and the PHD/PFD second output as the bottom signal input, and a third current (Ibp1) is supplied from the top source output response to the difference between the top and bottom signal inputs.

Additional details of the above-described method and a wide dynamic range charge pump circuit are provided below.

DETAILED DESCRIPTION

Figure 1:
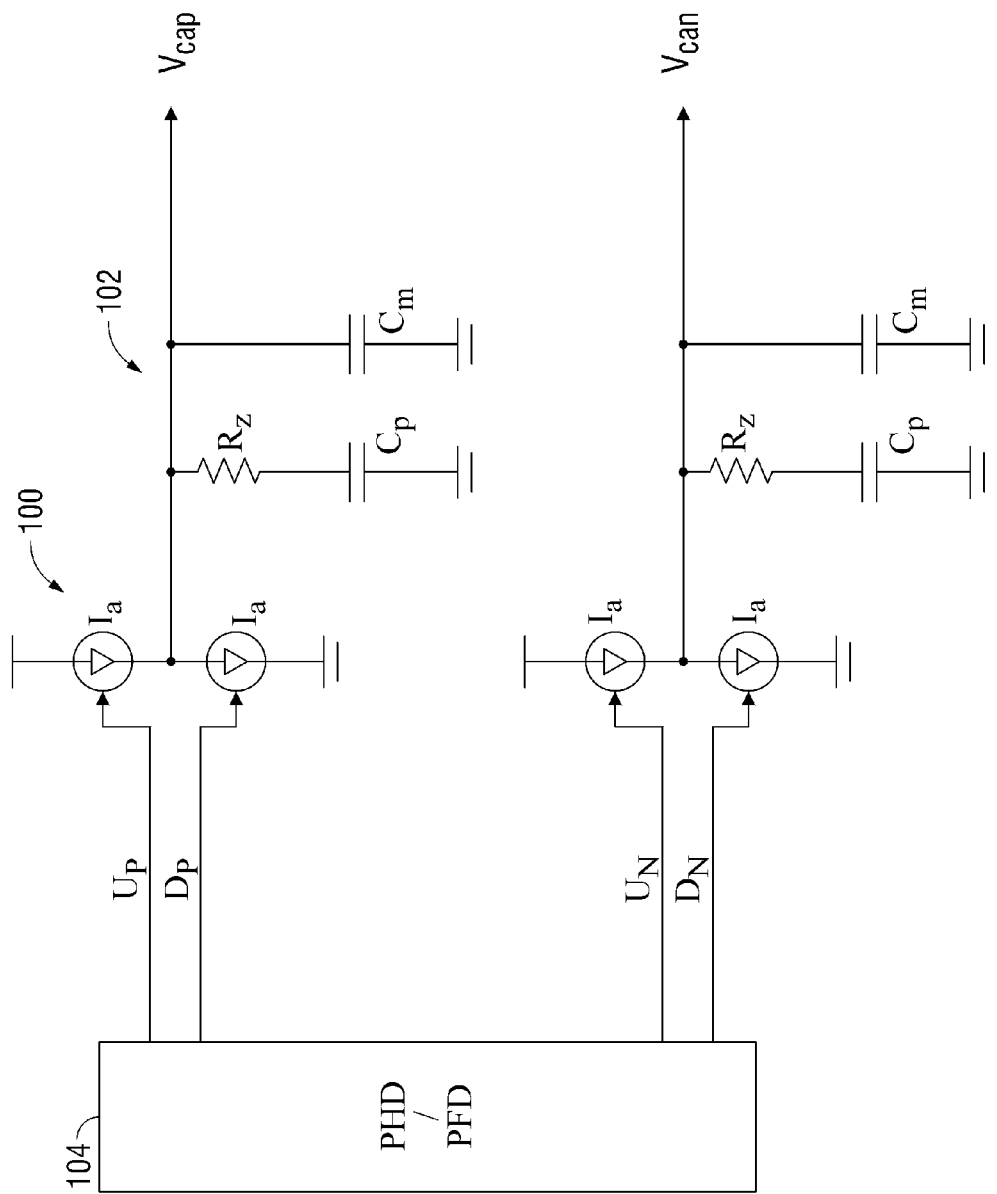
FIG. 1 is a schematic diagram of a conventional charge pump and loop filter (prior art).
Figure 2:
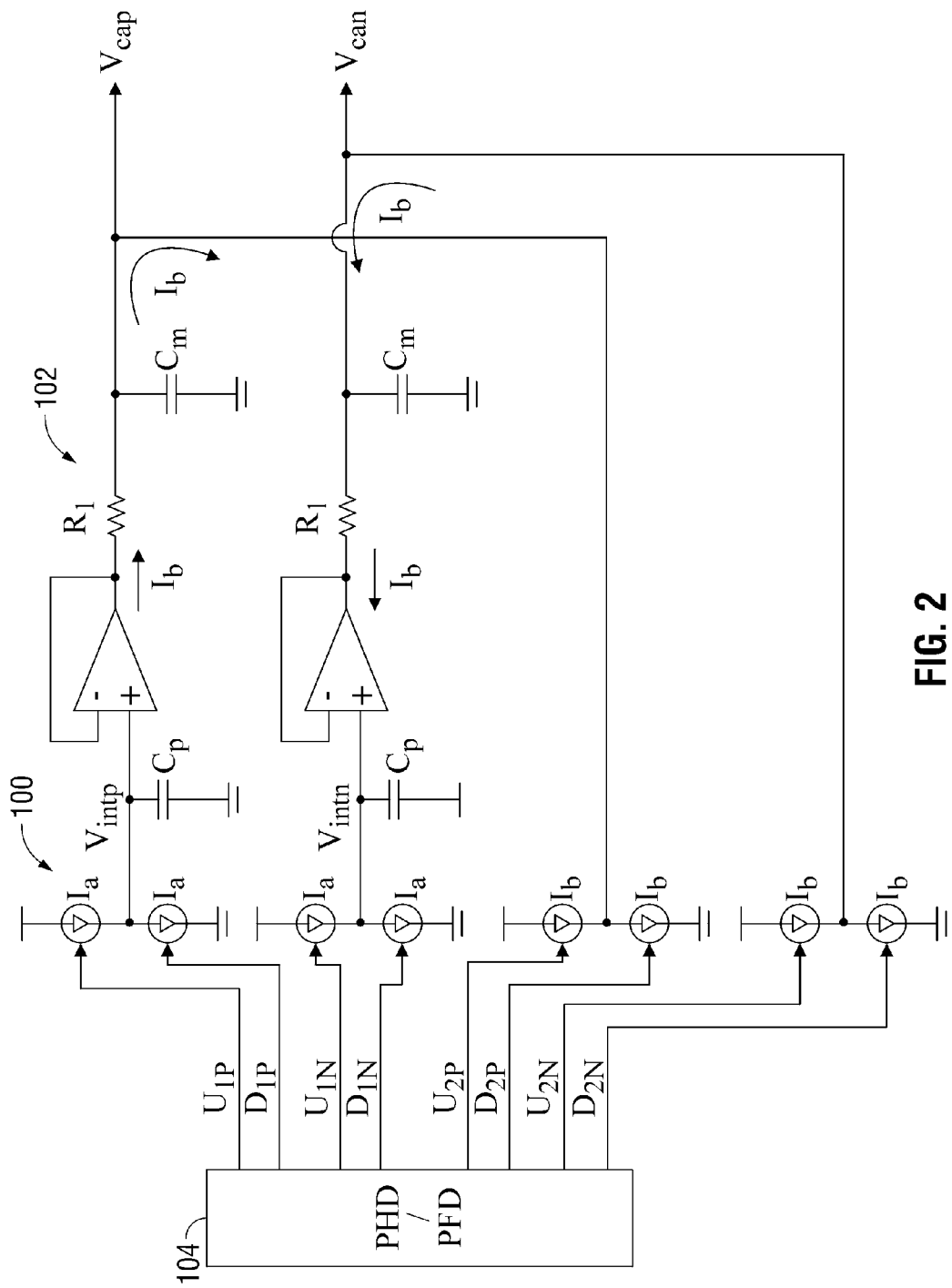
FIG. 2 is a schematic diagram of a charge pump and loop filter that circumvents the problems associated with the circuit of FIG. 1 (prior art).
Figure 3:
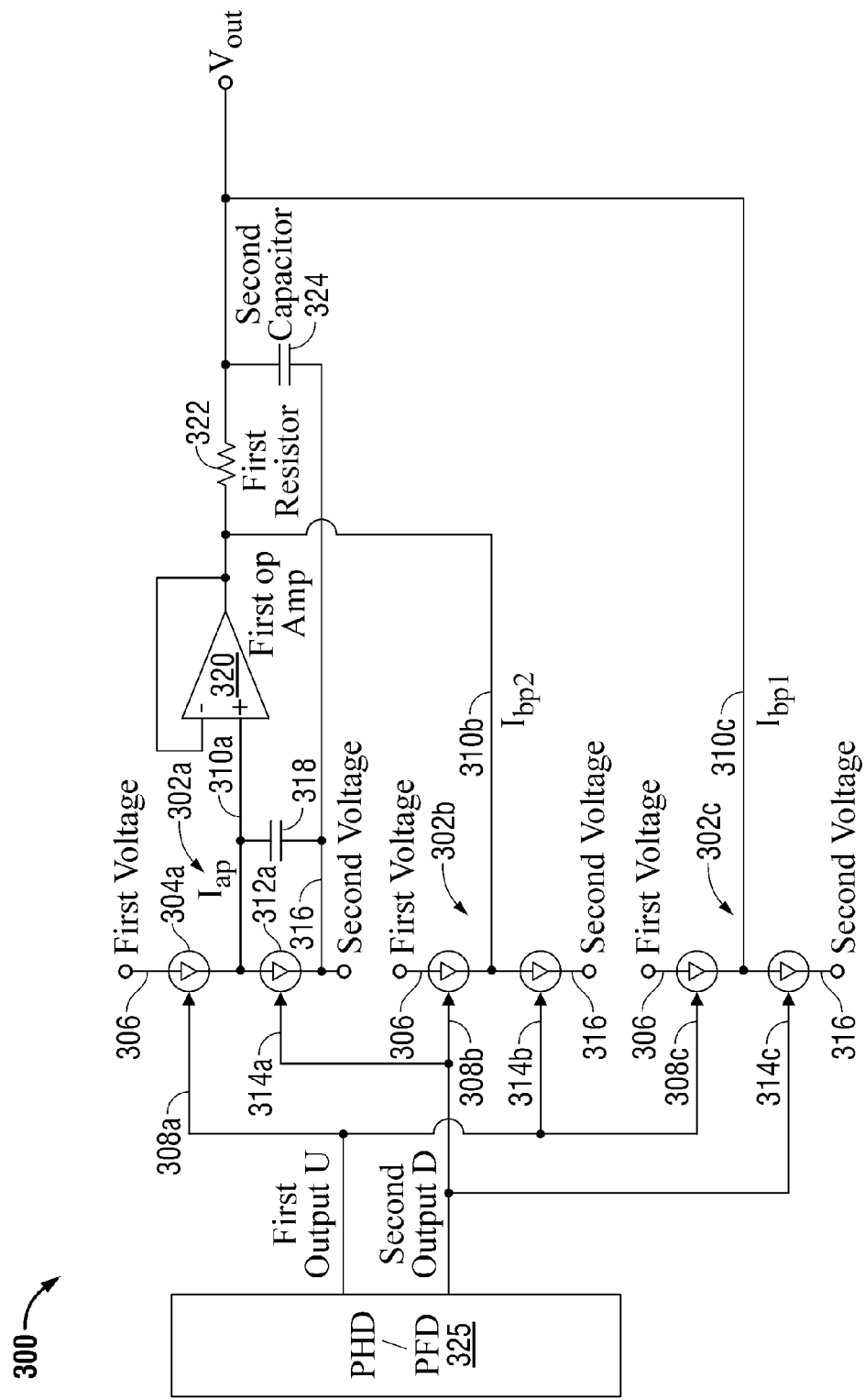
FIG. 3 is a schematic diagram of a wide dynamic range charge pump.

FIG. 3 is a schematic diagram of a wide dynamic range charge pump. The charge pump 300 may also be referred to as a combination charge pump and loop filter. The charge pump 300 comprises a first set of current sources 302a, a second set of current sources 302b, and a third set of current sources 302c. Many current source designs are well known in the art that would be suitable to enable the charge pump 300. Each set 302 comprises a top source 304 connected to a first reference voltage on line 306 and a top signal input on line 308, and an output on line 310 to supply current responsive to a top signal. Each set also includes a bottom source 312 connected to the top source output on line 310 and a bottom signal input on line 314, and an output on line 316 connected to a second reference voltage, different than the first reference voltage, to supply current in response to a bottom signal. For example, the first reference voltage may be a positive DC voltage and the second reference voltage may be ground.

A first capacitor 318 has an input connected to the first set top source output on line 310a, and an output connected to the second reference voltage on line 316. A first operational amplifier (op amp) 320 has an input connected to the first set top source output on line 310a, and an output connected to the second set top source output on line 310b. In one aspect, the first op amp 320 is a unity-gain op amp (unity gain buffer).

A first resistor 322 has a first end connected to the first op amp output on line 310b and a second end connected to the third set top source output on line 310c. A second capacitor 324 having an input connected to the first resistor second end on line 310c, and an output connected to the second reference voltage on line 316.

The first set 302a receives a phase detector/phase-frequency detector (PHD/PFD) first output as the top signal on line 308a and a PHD/PFD second output as the bottom signal input 314a, to supply a first current (Iap) from the top source output on line 310a in response to the difference between the top and bottom signal inputs. The signals are supplied by PHD/PFD 325. PHD/PFD 325 can be a Hogge, Bang Bang, or any type of phase or frequency detector known in the art. The second set 302b receives the PHD/PFD first output as the bottom signal on line 314b and the PHD/PFD second output as the top signal input on line 308b, to supply a second current (Ibp2) from the top source output on line 310b in response to the difference between the top and bottom signal inputs.

The third set 302c receives the PHD/PFD first output as the top signal on line 308c and the PHD/PFD second output as the bottom signal input on line 314c, to supply a third current (Ibp1) from the top source output on line 310c (Vout) in response to the difference between the top and bottom signal inputs.

In one aspect, the first set 302a supplies a first average value of Iap on line 310a. The second set 302b and third set 302c supply currents Ibp2 and Ibp1, respectively, each having a second average value greater than the first average value. The average value sum of Ibp1 and Ibp2 is approximately zero. Further, the sum of the Ibp1 and Ibp2 instantaneous values at any particular time is approximately zero. In another aspect, |Iap|<|Ibp1| and |Iap|<|Ibp2|.

Although not shown, Vout on line 310c may be connected to a VCO, with the VCO, PHD/PFD 325, and charge pump 300 being components in a PLL.

Figure 4:
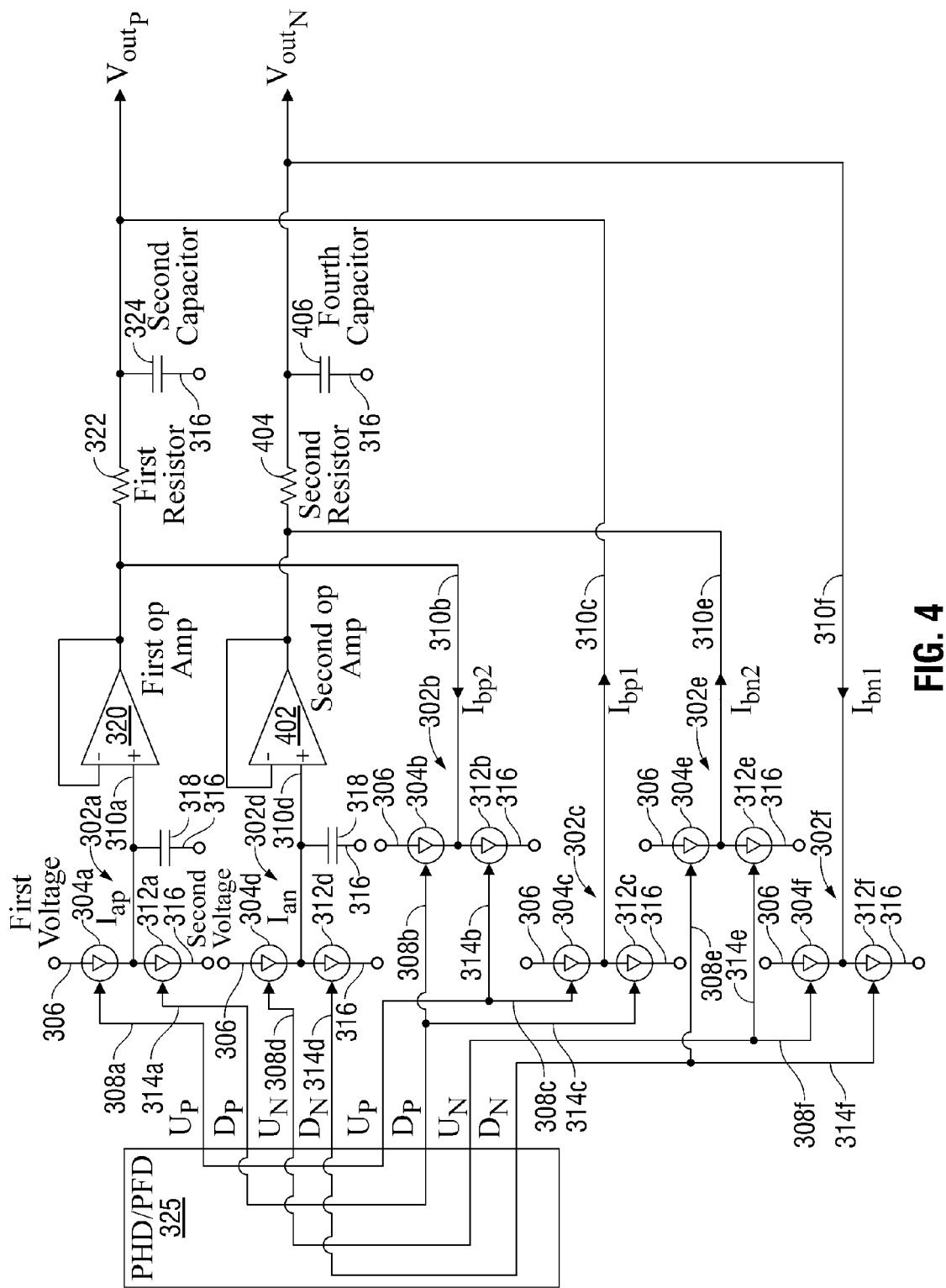
FIG. 4 is a schematic diagram of a wide dynamic range charge pump enabled with differential output voltages.

FIG. 4 is a schematic diagram of a wide dynamic range charge pump enabled with differential output voltages. The charge pump 400 of FIG. 4 includes all the components of FIG. 3. In addition, differential charge pump 400 comprises a fourth set of current sources 302d, a fifth set of current sources 302e, and sixth set of current sources 302f. Each current set is defined as above in the explanation of the charge pump of FIG. 3, with a top source 304 and a bottom source 312.

A third capacitor 400 has an input connected to the fourth set top source output on line 310d, and an output connected to the second reference voltage on line 316. A second op amp 402 has an input connected to the fourth set top source output on line 310d, and an output connected to the fifth set top source output on line 310e. Typically, the second op amp 402 is a unity-gain op amp. A second resistor 404 has a first end connected to the second op amp output on line 310e and a second end connected to the sixth set top source output on line 310f. A fourth capacitor 406 has an input connected to the second resistor second end on line 310f, and an output connected to the second reference voltage on line 316.

The fourth set 302d receives a PHD/PFD first differential output (Un) as the top signal on line 308d and a PHD/PFD second differential output as the bottom signal input on line 314d, to supply a fourth current (Ian) from the top source output on line 310d in response to the difference between the top and bottom signal inputs. The PHD/PFD first differential output signal Un on line 308d is a differential signal with respect to the PHD/PFD first output signal (Up) on line 308a. Likewise, the PHD/PFD second differential output signal Dn on line 314d is a differential signal with respect to the PHD/PFD second output signal (Dp) on line 314a.

The fifth set 302e receives the PHD/PFD first differential output as the bottom signal on line 314e and the PHD/PFD second differential output as the top signal input on line 308e, to supply a fifth current (Ibn2) from the top source output on line 310e in response to the difference between the top and bottom signal inputs. The sixth set 302f receives the PHD/PFD first differential output as the top signal on line 308f and the PHD/PFD second differential output as the bottom signal input on line 314f, to supply a sixth current (Ibn1) from the top source output in response to the difference between the top and bottom signal inputs.

The fourth set 302d supplies an average value of Ian. The fifth set 302e and the sixth set 302f supply currents Ibn2 and Ibn1, respectively, each an average value greater than the first average value. The average value sum of Ibn1 and Ibn2 is approximately zero. The sum of the Ibn1 and Ibn2 instantaneous values at any particular time is approximately zero. That is, the Ibn1 and Ibn2 currents will always have the same (opposite) magnitude. Typically, |Ian|<|Ibn1| and |Ian|<|Ibn2|. Further, |Ian|=|Iap|, |Ibp1|=|Ibn1|, and |Ibp2|=|Ibn2|.

Although not shown, $Vout_P$ on line 310c and $Vout_N$ on line 310f may be connected to a VCO with differential inputs, with the VCO, PHD/PFD 325, and charge pump 400 being components in a PLL.

Functional Description

Assuming that the Up output of the PHD/PFD 325 is wider than the Dp output, more Ibp1 is generated in average, pumping into resistor 322 on line 310c. Since Ibp2 is generated the same way as Ibp1 but in the opposite direction, Ibp1 flows through first resistor 322 and sinks through Ibp2, without going into the first op amp 320. Therefore, op amp 320 need not sink this current.

At the $Vout_N$ output on line 310f, the opposite happens, i.e. on average Ibn1=Ibp1. Note that Ibn1 is flowing away from second resistor 404, whereas Ibp1 is flowing into resistor 322. Since the charge pump current source control inputs are switched, Ibn2 is out of phase with Ibn1 at any instant, but is of the same absolute magnitude. As Ibn1 flows out of resistor 404, Ibn2 flows into it. Thus, there is no need for op amp 402 to provide current.

Even though Ibn1 has the same magnitude and the same current flow direction as Ibp2, its phase may differ from Ibp2, depending on the type of phase detector used. Typically, the instantaneous phases of Ibp1 and Ibp2 are exactly 180° different, so that they have opposite current flow directions at all times. Equivalently, the instantaneous phases of Ibn1 and Ibn2 are 180° different at any instant.

With this technique, the op amp output drive is effectively increased only in instances when its load demands (or pumps) more current. As a result, the op amps behave more like an ideal buffer (voltage source output). Since the op amps are no longer a limiting factor in the charge pump design, Ib can be set to the values that are beyond the op amp output's internal bias current level. Therefore, the loop bandwidth can be adjusted as far as it is practical without the risk of saturating the unity gain buffer.

For all practical applications, the PHD (PFD or any other detector) outputs are at the same level going into the current sources. The voltage averaging occurs at the output of the current sources. The PHD/PFD outputs continuously turn on and off the current sources they are driving, causing an average voltage build up across the capacitances at the outputs of current sources in the process. This average voltage build up is proportional to the phase difference between PHD inputs. However, each set of current sources can generate different values of currents from the same PHD (or PFD) output. The current (Ia) is typically much smaller than the currents (Ib1) and (Ib2), and the currents (Ib1) and (Ib2) are typically of the same magnitude, but opposite in direction.

Figure 5:
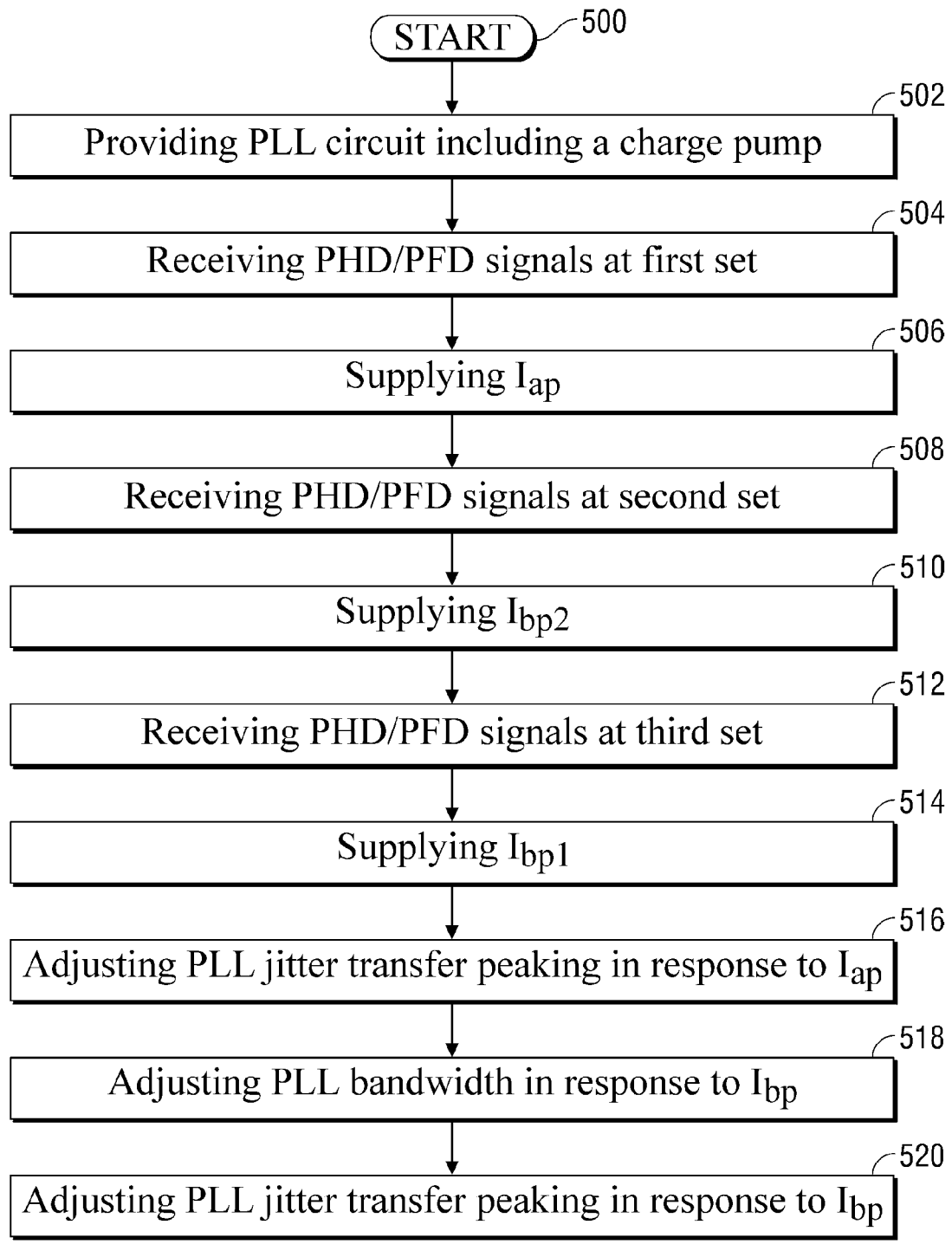
FIG. 5 is a flowchart illustrating a method for controlling current in a wide dynamic range charge pump, in a PLL circuit.

FIG. 5 is a flowchart illustrating a method for controlling current in a wide dynamic range charge pump, in a PLL circuit. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 500.

Step 502 provides a PLL including a phase/frequency detector, a charge pump, and a voltage controlled oscillator (VCO). The charge pump includes a first, second, and third set of current sources. Each set includes a top source connected to a first reference voltage and a top signal input, and an output to supply current responsive to a top signal. Each set also includes a bottom source connected to the top source output and a bottom signal input, and an output connected to a second reference voltage, different than the first reference voltage, to supply current in response to a bottom signal. The charge pump further includes a first capacitor having an input connected to the first set top source output, and an output connected to the second reference voltage. A first operational amplifier has an input connected to the first set top source output, and an output connected to the second set top source output and to a voltage controlled oscillator (VCO) input. A first resistor has a first end connected to the first op amp output and a second end connected to the third set top source output. A second capacitor has an input connected to the first resistor second end, and an output connected to the second reference voltage.

In Step 504 the first set receives a phase detector/phase-frequency detector (PHD/PFD) first output as the top signal and a PHD/PFD second output as the bottom signal input. Step 506 supplies a first current (Iap) from the top source output responsive to the difference between the top and bottom signal inputs. In Step 508 the second set receives the PHD/PFD first output as the bottom signal and the PHD/PFD second output as the top signal input. Step 510 supplies a second current (Ibp2) from the top source output responsive to the difference between the top and bottom signal inputs. In Step 512 the third set receives the PHD/PFD first output as the top signal and the PHD/PFD second output as the bottom signal input. Step 514 supplies a third current (Ibp1) from the top source output response to the difference between the top and bottom signal inputs.

In one aspect, Step 516 decreases PLL jitter transfer peaking in response to decreasing |Iap|, for a constant value of Ibp. Alternately, Step 516 increases PLL jitter transfer peaking in response to increasing |Iap|, for a constant value of Ibp.

In another aspect, Step 518 increases the PLL bandwidth in response to increasing |Ibp|, for a constant value of Iap. Alternately, Step 518 decreases the PLL bandwidth in response to decreasing |Ibp|, for a constant value of Iap.

In another aspect, Step 520 decreases PLL jitter transfer peaking in response to increasing |Ibp|, for a constant value of Iap. Alternately, Step 520 increases PLL jitter transfer peaking in response to decreasing |Ibp|, for a constant value of Iap.

A wide dynamic range charge pump has been provided. Particular circuit components and signals have been used to illustrate the invention. However, the invention is not necessarily limited to these exampled. Other variations and embodiments of the invention will occur to those skilled in the art.

I claim:

1. A wide dynamic range charge pump comprising:
   a first, second, and third set of current sources, each set comprising:
   a top source connected to a first reference voltage and a top signal input, and an output to supply current responsive to a top signal; and,
   a bottom source connected to the top source output and a bottom signal input, and an output connected to a second reference voltage, different than the first reference voltage, to supply current in response to a bottom signal;
   a first capacitor having an input connected to the first set top source output, and an output connected to the second reference voltage;
   a first operational amplifier (op amp) having an input connected to the first set top source output, and an output connected to the second set top source output;
   a first resistor having a first end connected to the first op amp output and a second end connected to the third set top source output;
   a second capacitor having an input connected to the first resistor second end, and an output connected to the second reference voltage;
   wherein the first set receives a phase detector/phase-frequency detector (PHD/PFD) first output as the top signal and a PHD/PFD second output as the bottom signal input, to supply a first current (Iap) from the top source output in response to the difference between the top and bottom signal inputs;
   wherein the second set receives the PFD first output as the bottom signal and the PHD/PFD second output as the top signal input, to supply a second current (Ibp2) from the top source output in response to the difference between the top and bottom signal inputs; and,
   wherein the third set receives the PHD/PFD first output as the top signal and the PHD/PFD second output as the bottom signal input, to supply a third current (Ibp1) from the top source output in response to the difference between the top and bottom signal inputs.

2. The charge pump of claim 1 wherein the first set supplies an average value of Iap; and,
   wherein the second and third sets supply currents Ibp2 and Ibp1, respectively, each having an average value greater than the first average value of Iap.

3. The charge pump of claim 2 wherein the average value sum of Ibp1 and Ibp2 is approximately zero.

4. The charge pump of claim 3 wherein the sum of the Ibp1 and Ibp2 instantaneous values at any particular time is approximately zero.

5. The charge pump of claim 2 wherein |Iap|<|Ibp1| and |Iap|<|Ibp2|.

6. The charge pump of claim 1 wherein the first op amp is a unity-gain op amp.

7. The charge pump of claim 1 further comprising:
   a fourth, fifth, and sixth set of current sources, each set comprising:

a top source connected to the first reference voltage and a top signal input, and an output to supply current responsive to a top signal; and, a bottom source connected to the top source output, and a bottom signal input, and an output connected to a second reference voltage, different than the first reference voltage, to supply current in response to a bottom signal;

a third capacitor having an input connected to the fourth set top source output, and an output connected to the second reference voltage;

a second op amp having an input connected to the fourth set top source output, and an output connected to the fifth set top source output;

a second resistor having a first end connected to the second op amp output and a second end connected to the sixth set top source output;

a fourth capacitor having an input connected to the second resistor second end, and an output connected to the second reference voltage;

wherein the fourth set receives a PHD/PFD first differential output as the top signal and a PHD/PFD second differential output as the bottom signal input, to supply a fourth current (Ian) from the top source output in response to the difference between the top and bottom signal inputs;

wherein the fifth set receives the PHD/PFD first differential output as the bottom signal and the PHD/PFD second differential output as the top signal input, to supply a fifth current (Ibn2) from the top source output in response to the difference between the top and bottom signal inputs; and, wherein the sixth set receives the PHD/PFD first differential output as the top signal and the PHD/PFD second differential output as the bottom signal input, to supply a sixth current (Ibn1) from the top source output in response to the difference between the top and bottom signal inputs.

8. The charge pump of claim 7 wherein the fourth set supplies an average value of Ian; and, wherein the fifth and sixth sets supply currents Ibn2 and Ibn1, respectively, each having an average value greater than the first average value of Ian.

9. The charge pump of claim 8 wherein the average value sum of Ibn1 and Ibn2 is approximately zero.

10. The charge pump of claim 9 wherein the sum of the Ibn1 and Ibn2 instantaneous values at any particular time is approximately zero.

11. The charge pump of claim 8 wherein |Ian|<|Ibn1| and |Ian|<|Ibn2|.

12. The charge pump of claim 7 wherein the second op amp is a unity-gain op amp.

13. The charge pump of claim 7 wherein |Ian|=|Iap|, |Ibp1|=|Ibn1|, and |Ibp2|=|Ibn2|.

14. In a phase-locked loop (PLL) circuit, a method for controlling current in a wide dynamic range charge pump, the method comprising:

providing a PLL including a phase/frequency detector, a charge pump, and a voltage controlled oscillator (VCO), wherein the charge pump includes:

a first, second, and third set of current sources, each set including:

a top source connected to a first reference voltage and a top signal input, and an output to supply current responsive to a top signal; and, a bottom source connected to the top source output and a bottom signal input, and an output connected to a second reference voltage, different than the first reference voltage, to supply current in response to a bottom signal;

a first capacitor having an input connected to the first set top source output, and an output connected to the second reference voltage;

a first operational amplifier (op amp) having an input connected to the first set top source output, and an output connected to the second set top source output and to a voltage controlled oscillator (VCO) input;

a first resistor having a first end connected to the first op amp output and a second end connected to the third set top source output;

a second capacitor having an input connected to the first resistor second end, and an output connected to the second reference voltage;

at the first set, receiving a phase detector/phase-frequency detector (PHD/PFD) first output as the top signal and a PHD/PFD second output as the bottom signal input;

supplying a first current (Iap) from the top source output responsive to the difference between the top and bottom signal inputs;

at the second set, receiving the PHD/PFD first output as the bottom signal and the PHD/PFD second output as the top signal input;

supplying a second current (Ibp2) from the top source output responsive to the difference between the top and bottom signal inputs;

at the third set, receiving the PHD/PFD first output as the top signal and the PHD/PFD second output as the bottom signal input; and, supplying a third current (Ibp1) from the top source output response to the difference between the top and bottom signal inputs.

15. The method of claim 14 further comprising:

for a constant value of Ibp, decreasing PLL jitter transfer peaking in response to decreasing |Iap|; and, for a constant value of Ibp, increasing PLL jitter transfer peaking in response to increasing |Iap|.

16. The method of claim 14 further comprising:

for a constant value of Iap, increasing the PLL bandwidth in response to increasing |Ibp|; and, for a constant value of Iap, decreasing the PLL bandwidth in response to decreasing |Ibp|.

17. The method of claim 14 further comprising:

for a constant value of Iap, decreasing PLL jitter transfer peaking in response to increasing |Ibp|; and, for a constant value of Iap, increasing PLL jitter transfer peaking in response to decreasing |Ibp|.

\* \* \* \* \*